US005578507A

United States Patent [19]

Kuroi

[11] Patent Number: 5,578,507
[45] Date of Patent: Nov. 26, 1996

[54] METHOD OF MAKING A SEMICONDUCTOR DEVICE HAVING BURIED DOPED AND GETTERING LAYERS

[75] Inventor: Takashi Kuroi, Hyogo-ken, Japan

[73] Assignee: Mitsubishi Denki Kabushiki Kaisha, Tokyo, Japan

[21] Appl. No.: 439,017

[22] Filed: May 11, 1995

Related U.S. Application Data

[62] Division of Ser. No. 279,876, Jul. 25, 1994, which is a continuation of Ser. No. 902,424, Apr. 24, 1992, abandoned, which is a continuation-in-part of Ser. No. 660,824, Feb. 26, 1991, abandoned.

[30] Foreign Application Priority Data

Apr. 28, 1990 [JP] Japan ................................ 2-113057

[51] Int. Cl.$^6$ .................................................. H01L 21/265
[52] U.S. Cl. ............................ 437/24; 437/26; 437/11
[58] Field of Search ................................ 437/24, 26, 10, 437/11, 61, 74, 62, 67; 148/DIG. 85, DIG. 86; 257/611

[56] References Cited

U.S. PATENT DOCUMENTS

| 3,622,382 | 11/1971 | Brack | 437/26 |
|---|---|---|---|
| 3,961,355 | 6/1976 | Abbas et al. | 357/20 |
| 4,053,925 | 10/1977 | Burr et al. | 357/64 |
| 4,056,408 | 11/1977 | Bartko | 437/26 |
| 4,317,686 | 3/1982 | Anand et al. | 357/23 |
| 4,509,990 | 4/1985 | Vasudev | 437/26 |
| 4,712,123 | 12/1987 | Miyatake et al. | 357/23.6 |
| 4,885,257 | 12/1989 | Matsushita | 437/11 |
| 4,887,135 | 12/1989 | Cheney et al. | 357/23.6 |
| 4,923,820 | 5/1990 | Beasom | 437/12 |
| 4,931,405 | 6/1990 | Kamijo et al. | 437/12 |
| 4,948,742 | 8/1990 | Nishimura et al. | 437/26 |
| 4,962,051 | 10/1990 | Liaw | 437/26 |
| 5,075,751 | 12/1991 | Tomii et al. | 357/64 |
| 5,098,852 | 3/1992 | Niki et al. | 437/11 |
| 5,250,445 | 10/1993 | Beam et al. | 437/11 |
| 5,279,978 | 1/1994 | See et al. | 437/62 |
| 5,389,563 | 2/1995 | Kuroi et al. | 437/31 |
| 5,426,062 | 6/1995 | Hwang | 437/26 |

FOREIGN PATENT DOCUMENTS

| 0032022 | 8/1984 | European Pat. Off. . |
| 232138A1 | 1/1986 | Germany . |
| 3743734A1 | 7/1989 | Germany . |
| 3833161A1 | 4/1990 | Germany . |

OTHER PUBLICATIONS

"Proximity Gettering with Mega–Electron–Volt Carbon and Oxygen Implantations" by H. Wong et al., *Applied Physics Letter*, 52(12), Mar. 21, 1988, pp. 1023–1025.

D. Pramanik and M. Currens "MeV Implantation for Silicon Device Fabrication," *Solid State Technology*, (May 1984), pp. 211–216.

Kamins et al., "Heavy metal gettering on silicon–on–insulator structures formed by oxygen implantation into silicon", *J. Appl. Phys.* 58(7), 1 Oct. 1985, pp. 2559–2563.

J. B. Dinklage et al., "Gettering by Ion Implantation," *IBM Technical Disclosure Bulletin*, vol. 19, No. 11, (Apr. 1977), p. 4091.

K. E. Bean et al., "Germanium Doped Silicon Misfit Dislocation Gettering and Strin Layer Superlattice Structures Via Conventional CVD Epitaxy", *Electrochemical Society*, vol. 8–1 (May 1988), pp. 1–22.

*Primary Examiner*—George Fourson
*Assistant Examiner*—S. Mulpuri
*Attorney, Agent, or Firm*—Lowe, Price, LeBlanc & Becker

[57] ABSTRACT

A semiconductor device includes a buried impurity layer formed at a predetermined depth from a main surface of a semiconductor substrate by utilizing ion injection of a conductivity type determining element, and a gettering layer formed in a position adjacent to and not shallower than the buried impurity layer by utilizing ion injection of an element other than a conductivity type determining element.

6 Claims, 11 Drawing Sheets

METHOD OF MAKING A SEMICONDUCTOR DEVICE HAVING BURIED DOPED AND GETTERING LAYERS

This application is a division of application Ser. No. 08/279,876 filed Jul. 25, 1994, which is a continuation of Ser. No. 07/902,424 filed Apr. 24, 1992, now abandoned which is a Continuation-in-Part application of Ser. No. 07/660,824 filed Feb. 26, 1991 now abandoned.

BACKGROUND OF THE INVENTION

1. Field of the Invention

This invention relates to a semiconductor device and a manufacturing method therefor. More particularly, the invention relates to improvements in a semiconductor device and a manufacturing method therefor, the device including a buried impurity layer formed in a semiconductor substrate by using ion injection.

2. Description of the Background Art

It is known that, generally, a buried impurity layer is provided for an integrated circuit including a plurality of MOS transistors in order to prevent software errors due to alpha particles and to prevent latchups. It is also known that a buried impurity layer is provided for a bipolar transistor to act as a floating collector.

Figure 9A:
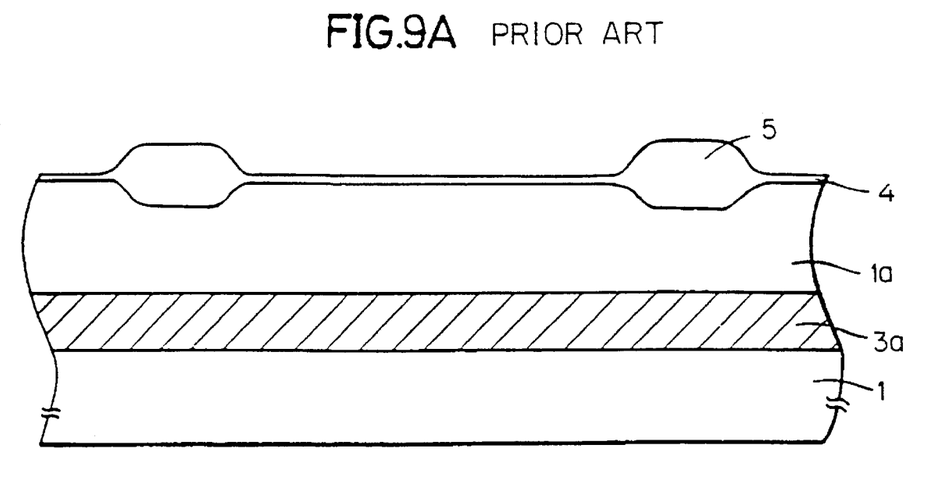
FIG. 9A is a sectional view of a semiconductor substrate including a buried impurity layer according to the prior art, which is formed by utilizing diffusion of impurities and epitaxial growth.

As shown in FIG. 9A which is a sectional view, a buried impurity layer 3a, usually, is formed by diffusing an element that determines the conductivity type, such as boron, phosphorus or arsenic, on a main surface of a semiconductor substrate 1, and superposing an epitaxial layer 1a in a thickness of several micrometers on the impurity layer 3a. The epitaxial layer 1a is covered with an insulating film 4 and isolation regions 5. A semiconductor device such as a MOS transistor (not shown) is formed on the epitaxial layer 1a in an area surrounded by the isolation regions 5. However, it is time-consuming and costly to form the buried impurity layer 3a by diffusion and to cause growth of the epitaxial layer 1a.

Figure 9B:
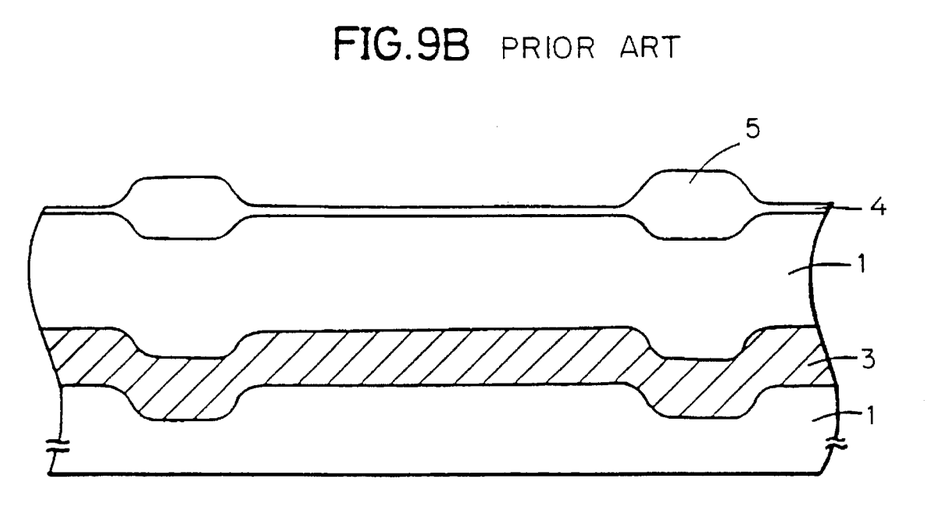
FIG. 9B is a sectional view of a semiconductor substrate including a buried impurity layer according to the prior art, which is formed by utilizing ion injection.

Thus, as shown in FIG. 9B, attempts have been made in recent years to utilize ion injection in forming a buried impurity layer in a short time and at a relatively low cost. More particularly, a buried impurity layer 3 is formed by ion injection, with a high energy in the range of several hundred keV to several MeV, of an element that determines the conductivity type, through an insulating film 4 into positions of a semiconductor substrate 1 at a depth of several micrometers. Then the substrate 1 is heat-treated in order to activate the buried impurity layer 3 and to eliminate primary crystal defects due to the ion injection.

During the heat treatment, the disappearance of the primary crystal defects in the buried impurity layer 3 due to the ion injection progresses inwardly from top and bottom of the impurity layer 3. However, secondary defects such as dislocations and stacking faults tend to remain in inner positions of the impurity layer 3. In the regions upwardly of the buried impurity layer 3 where the ions have passed, the primary defects such as vacancies tend to remain which retard recovery of crystallinity. Such residual defects can be a cause of increases in the leak current of the substrate.

Figure 10:
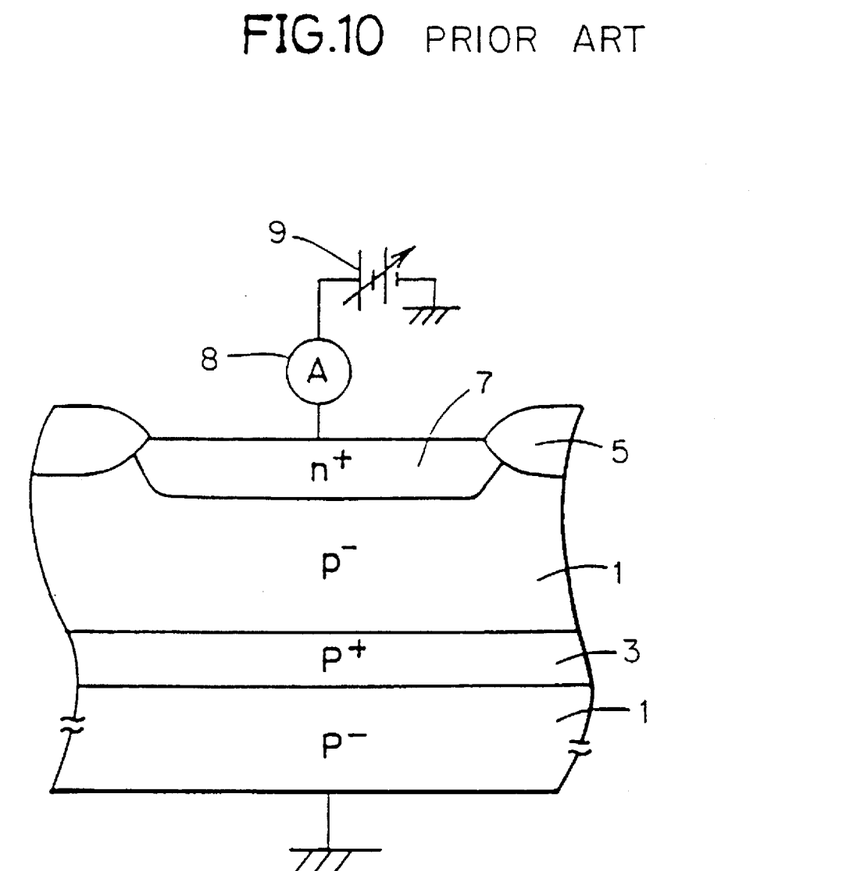
FIG. 10 is a conceptual view illustrating a method of measuring leak current of a semiconductor substrate.

Referring to FIG. 10, an example of methods for measuring the leak current of a semiconductor substrate 1 including a buried impurity layer 3 is illustrated. In FIG. 10, a p⁻ substrate 1 includes a buried p⁺ impurity layer 3. An n⁺ impurity region 7 is formed on an upper surface of the p⁻ substrate 1. The n⁺ impurity region 7 is connected through an ammeter 8 to a variable positive voltage source 9. The substrate 1 has a grounded bottom surface. In this way, the leak current may be measured by applying a reverse bias voltage to the semiconductor substrate 1.

Figure 11A:
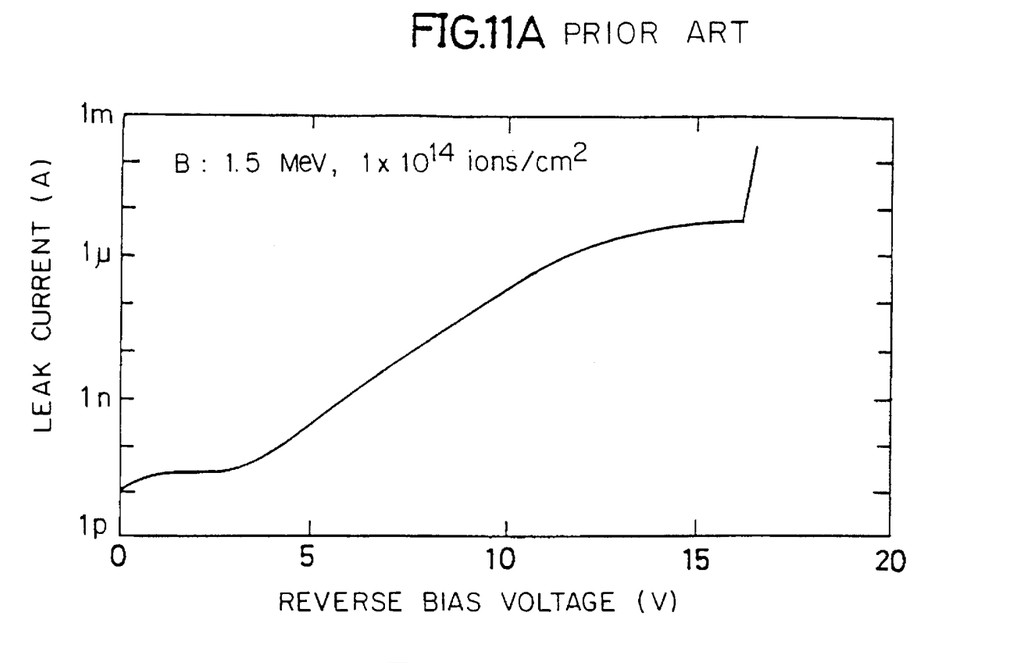
FIGS. 11A and 11B are graphs showing leak currents of semiconductor substrates according to the prior art as shown in FIGS. 9A and 9B, respectively.

Referring to FIG. 11A, an example of leak current of a substrate measured by the method of FIG. 10 is shown. In FIG. 11A, the substrate is injected with boron ions with an accelerating energy of 1.5 MeV in $1\times10^{14}$ ions/cm$^2$, and thereafter annealed in a nitrogenous atmosphere at 1000° C. for one hour. The horizontal axis represents the reverse bias voltage (V), and the vertical axis the leak current (A). It will be seen that the leak current of the substrate increases markedly at the reverse bias voltage of about 3.5V and above, and that this substrate is unavailable for practical purposes. It is believed that this increase in the leak current is caused by the residual crystal defects due to the ion injection.

Figure 11B:
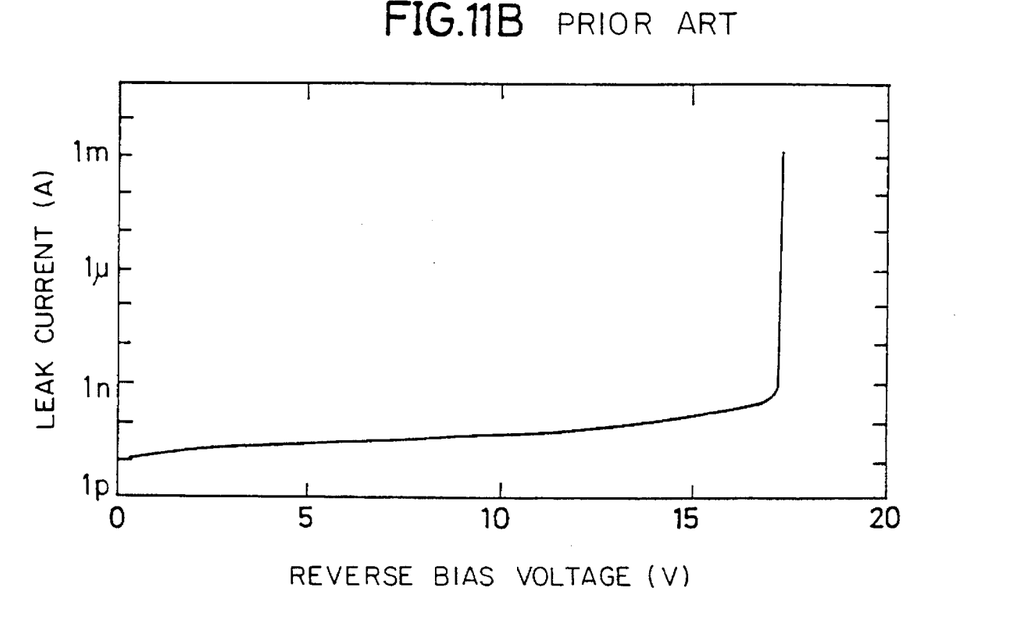

FIG. 11B shows, for purposes of comparison, a leak current of a semiconductor substrate including a buried impurity layer formed by diffusing boron and an epitaxial layer superposed thereon. In FIG. 11B, the leak current shows little increase at the reverse bias voltage up to about 17V since the semiconductor substrate includes no lattice defects due to ion injection.

As noted above, a buried impurity layer may be formed in a semiconductor substrate in a short time and at low cost by utilizing high energy ion injection. However, a substrate including a buried impurity layer formed in this way is not fit for practical use because of the great leak current.

SUMMARY OF THE INVENTION

An object of this invention is to provide a semiconductor device including a buried impurity layer which may be formed in a short time and at low cost.

A semiconductor device, according to one aspect of this invention, includes a buried impurity layer formed at a predetermined depth from a main surface of a semiconductor substrate by utilizing ion injection of a conductivity type determining element, and a gettering layer formed in a position adjacent to and not shallower than the buried impurity layer by utilizing ion injection of an element other than a conductivity type determining element.

According to another aspect of this invention, a method of manufacturing a semiconductor device comprises the steps of forming a gettering layer by ion-injecting an element other than a conductivity type determining element with a high energy to a predetermined depth from a main surface of a semiconductor substrate, and heat-treating the semiconductor substrate; and forming a buried impurity layer by ion-injecting a conductivity type determining element with a high energy to a position not deeper than the gettering layer, and heat-treating the semiconductor substrate.

In the semiconductor device according to this invention, a gettering layer is formed in a position adjacent to and not shallower than the buried impurity layer formed by utilizing ion injection. Consequently, the crystal defects due to the ion injection are absorbed into the gettering layer. Thus, a semiconductor device is provided which has a reduced leak current though it includes the buried impurity layer formed by utilizing ion injection.

In the method of manufacturing a semiconductor device according to this invention, a buried impurity layer and a gettering layer are both formed by utilizing ion injection. This method, therefore, enables a semiconductor device including a buried impurity layer and having a reduced leak current to be manufactured in a short time and at low cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

It is known that gettering technique may be used effectively in order to achieve a high yield in manufacture of LSI devices. Gettering technique is intended for introducing crystal defects accompanying stress fields, such as dislocations and precipitated particles, and absorbing into the gettering region and removing harmful heavy metal impurities, point defects and the like from regions for forming semiconductor devices such as MOS transistors.

Recently, Wong et al stated in Applied Physics Letter, 52(12), 21 Mar. 1988, pp. 1023–1025 that a gettering layer could be formed by ion-injecting oxygen element or carbon element with a high accelerating energy of several hundred keV to several MeV into positions several micrometers deep inside a silicon substrate. A gettering layer formed by utilizing ion injection as above lies near a substrate surface for forming semiconductor devices such as MOS transistors, and hence is expected to produce a powerful gettering effect.

Figure 2A:
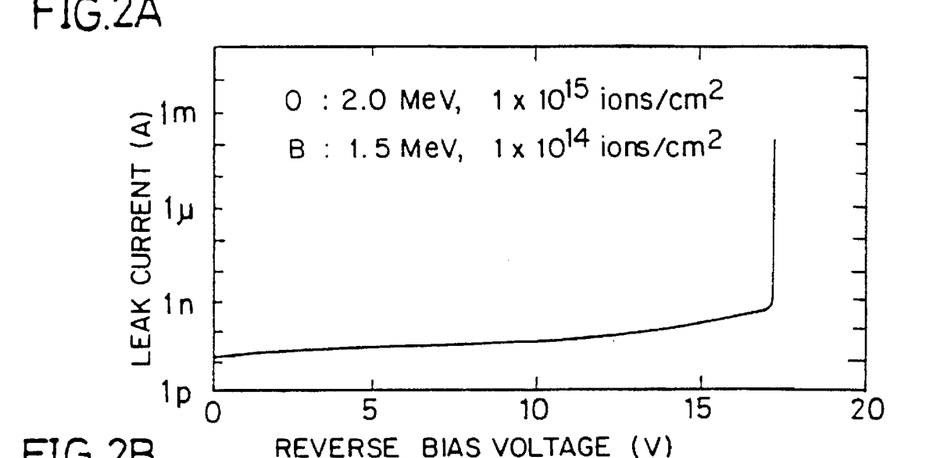
FIGS. 2A through 2C are graphs showing leak currents of semiconductor substrates including buried impurity layers and gettering layers formed under various ion-injecting conditions.
Figure 12A:
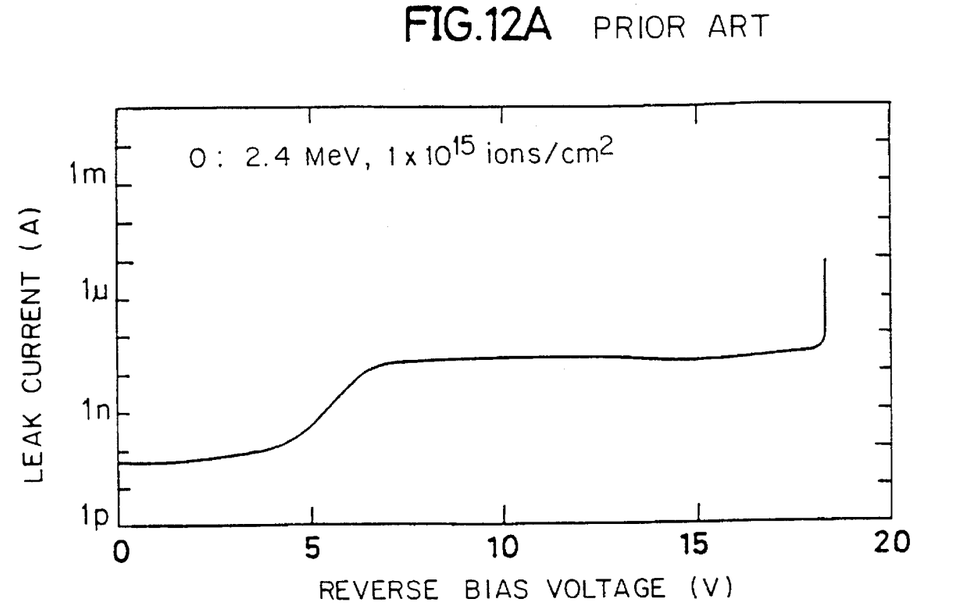
FIGS. 12A and 12B are graphs showing leak currents of semiconductor substrates according to the prior art including gettering layers formed by utilizing ion injection.
Figure 12B:
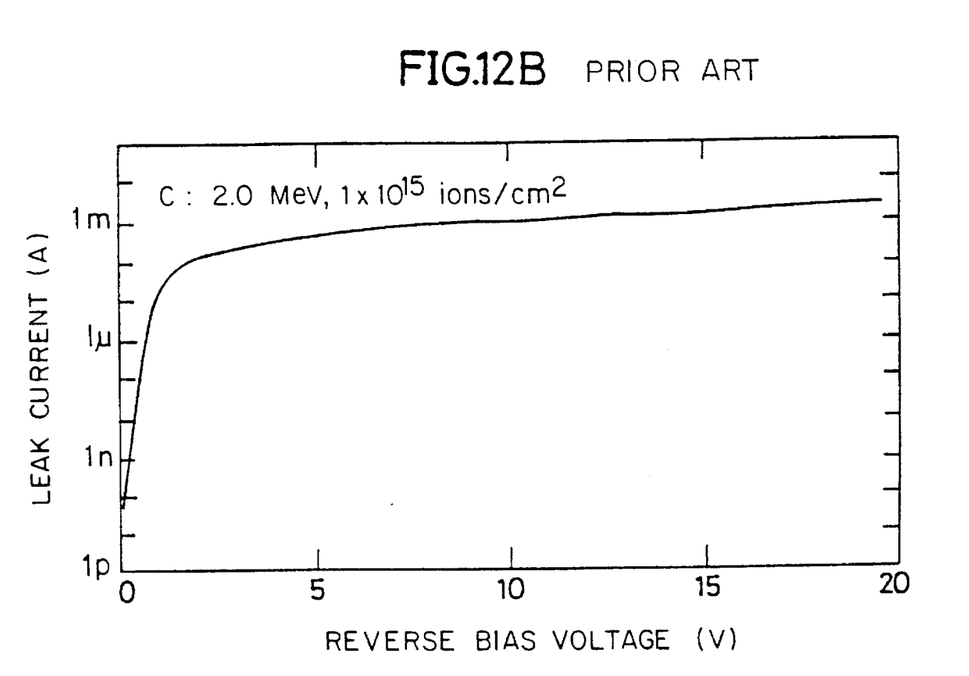

However, as shown in FIGS. 12A and 12B, semiconductor substrates including gettering layers formed by utilizing ion injection tend to show large leak currents. In FIG. 2A, a gettering layer is formed by heat-treating a semiconductor substrate into which oxygen has been ion-injected in $1\times10^{15}$ ions/cm$^2$ with an accelerating energy of 2.4 MeV. This substrate shows the leak current increasing at a reverse bias voltage of about 5V and above. In FIG. 12B, a gettering layer is formed by heat-treating a semiconductor substrate into which carbon has been ion-injected in $1\times10^{15}$ /cm$^2$ with an accelerating energy of 2.0 MeV. This substrate shows the leak current greatly increasing at a reverse bias voltage of about 2V and above.

The reason for the large leak current of a semiconductor substrate including a gettering layer formed by utilizing ion injection is believed to lie in that the reverse bias voltage causes a depletion layer extending in the direction of depth of the semiconductor substrate to reach crystal defects such as dislocations present in the gettering layer at shallow positions of several micrometers down, whereby these crystal defects cause the increase in the leak current. Thus, a gettering layer formed by utilizing ion injection is expected, under ordinary circumstances, to further increase the leak current in the semiconductor substrate including a buried impurity layer formed by utilizing ion injection. In spite of such a situation, the present inventors have undertaken to form not only a buried impurity layer but also a gettering layer in the semiconductor substrate by utilizing ion injection.

A method of manufacturing a semiconductor device in one embodiment of this invention will be described with reference to sectional views shown in FIGS. 1A through 1C.

Figure 1A:
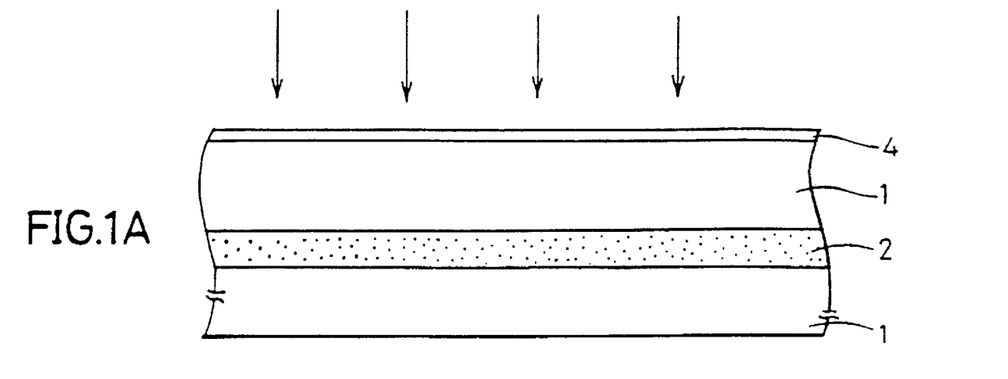
FIGS. 1A through 1C are sectional views illustrating a method of manufacturing a semiconductor device in one embodiment of this invention.

Referring to FIG. 1A first, an oxide film 4 having a thickness of several hundred Å is formed on a surface of a silicon semiconductor substrate 1. Then, as indicated by arrows, oxygen is ion-injected in $1\times10^{14}$ to $1\times10^{15}$ ions/cm$^2$ with an accelerating energy of several hundred keV to several MeV to depths of several micrometers into the substrate 1. As a result, an oxygen-injected layer 2 is formed.

Figure 1B:
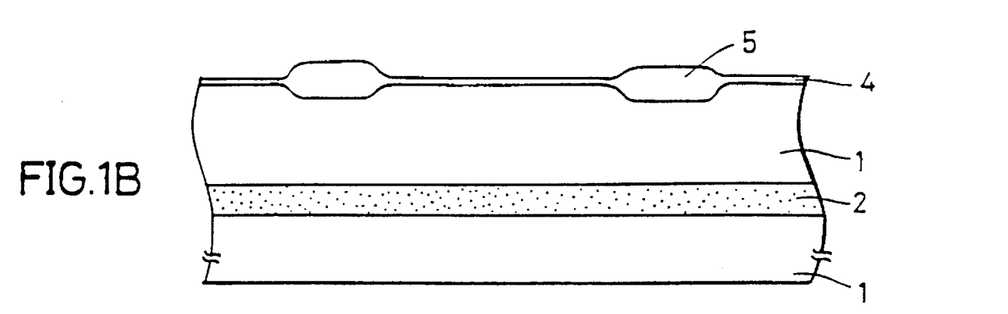

Referring to FIG. 1B, isolation oxide layers 5 are formed by selective thermal oxidation. At this time, secondary crystal defects are formed in the oxygen-injected layer 2, particularly in central portions thereof, to act as sinks for gettering.

Figure 1C:
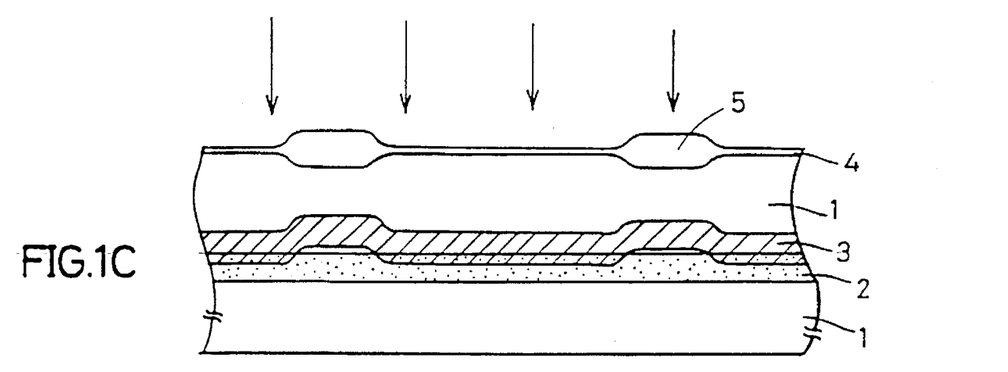

Referring to FIG. 1C, as indicated by arrows, a conductivity type determining element such as boron, phosphorus or arsenic is ion-injected with a high energy in $1\times10^{13}$ to $1\times10^{16}$ ions/cm$^2$ to positions not deeper than the gettering layer 2. As a result, a buried impurity layer 3 is formed. The buried impurity layer 3 is activated through an annealing treatment carried out in a nitrogenous atmosphere at 1000° C. for one hour. The primary defects due to the ion injection are expected to be absorbed into the gettering layer 2 at this time.

Referring to FIG. 2A, an example of leak current of a semiconductor substrate having a construction as in FIG. 1C is shown. The horizontal axis represents the reverse bias voltage (V), and the vertical axis the leak current (A). In FIG. 2A, the substrate is injected with oxygen ions with an energy of 2.0 MeV in $1\times10^{15}$ ions/cm$^2$ and with boron ions with an energy of 1.5 MeV in $1\times10^{14}$ ions/cm$^2$.

As seen from FIG. 2A, the leak current of the substrate increases little at the reverse bias voltage up to about 17V. Thus, the semiconductor substrate shown in FIG. 2A, though it includes a buried impurity layer formed by utilizing ion injection, produces a much less leak current than the known semiconductor substrate shown in FIG. 11A. Compared with the substrate shown in FIG. 12A which includes only a gettering layer, the semiconductor substrate shown in FIG. 2A has a greatly reduced leak current particularly at the reverse bias voltage of about 5V and above.

This unexpected reduction of the leak current may be considered to have the following two reasons (1) and (2):

(1) The primary defects introduced at the time of boron ion injection are absorbed into the gettering layer during the annealing treatment. Consequently, no crystal defects are present at least in positions shallower than the top of the buried impurity layer.

(2) The buried impurity layer including no crystal defects is formed in a position shallower than the middle portion of the gettering layer having a high concentration of secondary defects. Thus, the depletion layer is restrained from reaching the secondary defects in the middle portion of the gettering layer.

The gettering layer 2 as shown in FIG. 1C does not disappear through the subsequent heat treatment. Thus, also in the process of forming a semiconductor device such as a MOS transistor on the surface of the semiconductor substrate 1, the gettering layer 2 produces the gettering effect for removing harmful heavy metal impurities from adjacent the substrate surface. That is, the leak current flowing through the substrate may be checked effectively during operation of such a semiconductor device.

Further, the semiconductor substrate of FIG. 2A shows a leak current similar to that of the substrate of FIG. 11B including the buried impurity layer 3a formed without utilizing ion injection. However, a semiconductor substrate including a buried impurity layer formed by utilizing diffusion of impurities and growth of an epitaxial layer shows a relatively strong leak current at certain locations. This is considered due to the fact that different locations of the substrate have different concentrations of the crystal defects introduced during the epitaxial growth and different undesirable concentrations of impurities. However, the semiconductor substrate as shown in FIG. 1C involves hardly any variations in the leak current occurring at different locations. The reason is believed to lie in that the gettering layer 2 uniforms the entire substrate by absorbing crystal defects and undesirable impurities present locally.

Figure 2B:
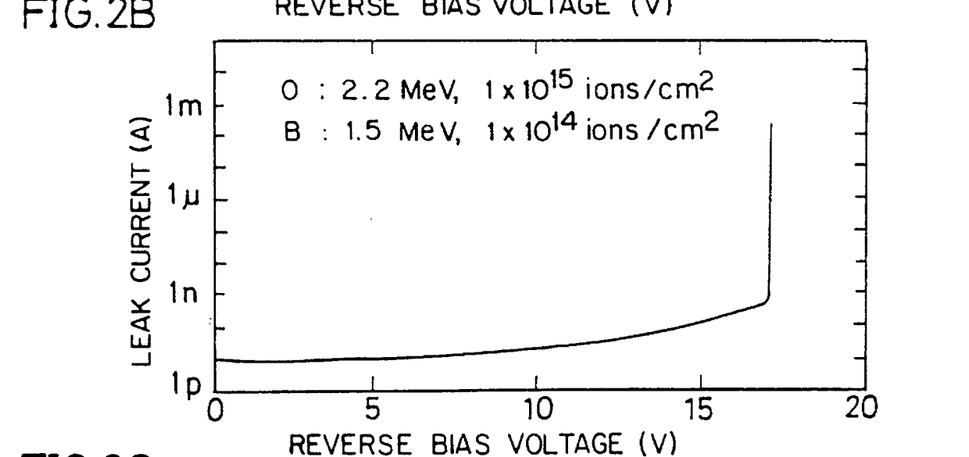
Figure 2C:
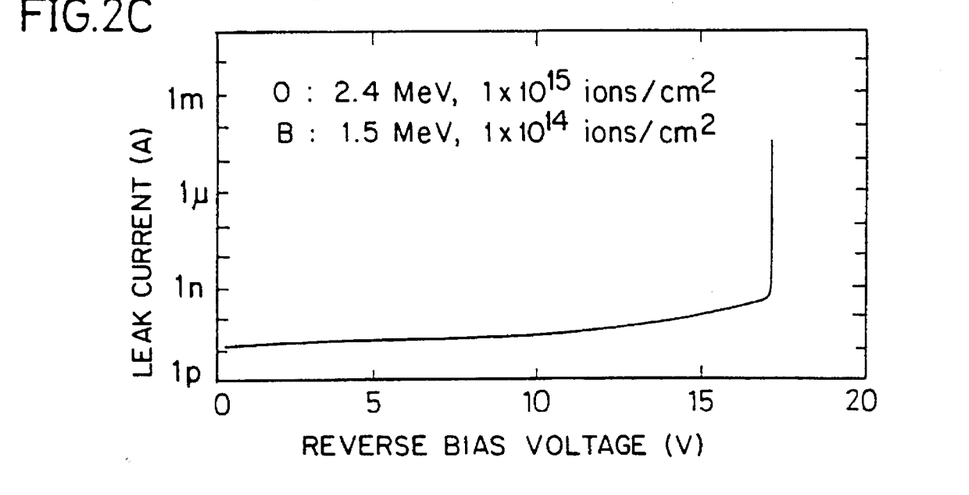

FIGS. 2B and 2C resemble FIG. 2A, but in FIGS. 2B and 2C oxygen is ion-injected with energies of 2.2 MeV and 2.4 MeV, respectively. The gettering layer in FIG. 2B is formed at a greater depth than the gettering layer in FIG. 2A. The gettering layer in FIG. 2C is formed at a still greater depth than the gettering layer in FIG. 2B. It will be seen that the gettering layer 2 demonstrates a sufficient gettering effect despite certain variations in its depth, and that the leak current of the substrate is sufficiently restrained as long as the gettering layer 2 is formed in a position not shallower than the buried impurity layer 3.

Figure 3:
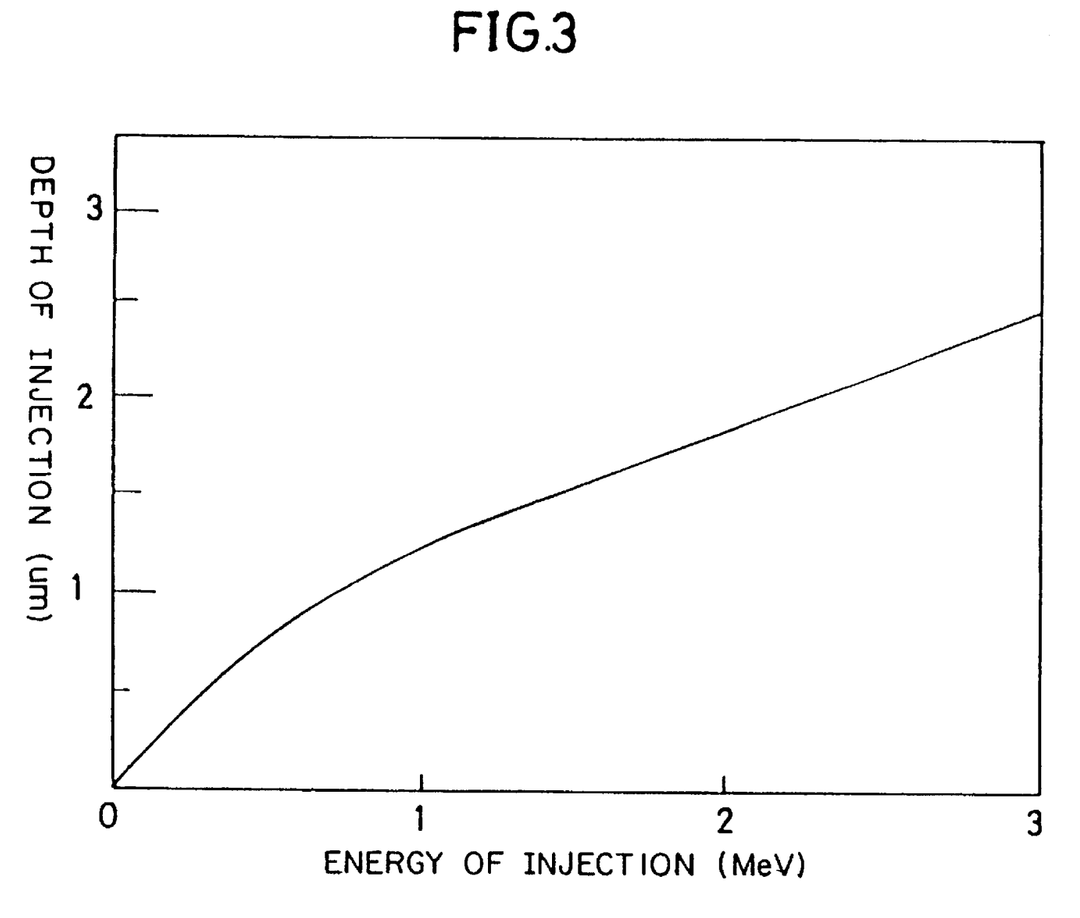
FIG. 3 is a graph showing a relationship between energy and depth of injecting oxygen ions into a silicon substrate.

The relationship between injection energy and injection depth of ions may readily be determined experimentally. For example, FIG. 3 shows a relationship between accelerating energy and injection depth in the injection of oxygen ions into a silicon substrate. The horizontal axis represents the accelerating energy of ions, and the vertical axis the depth of oxygen ions injected into the silicon substrate.

Figure 4:
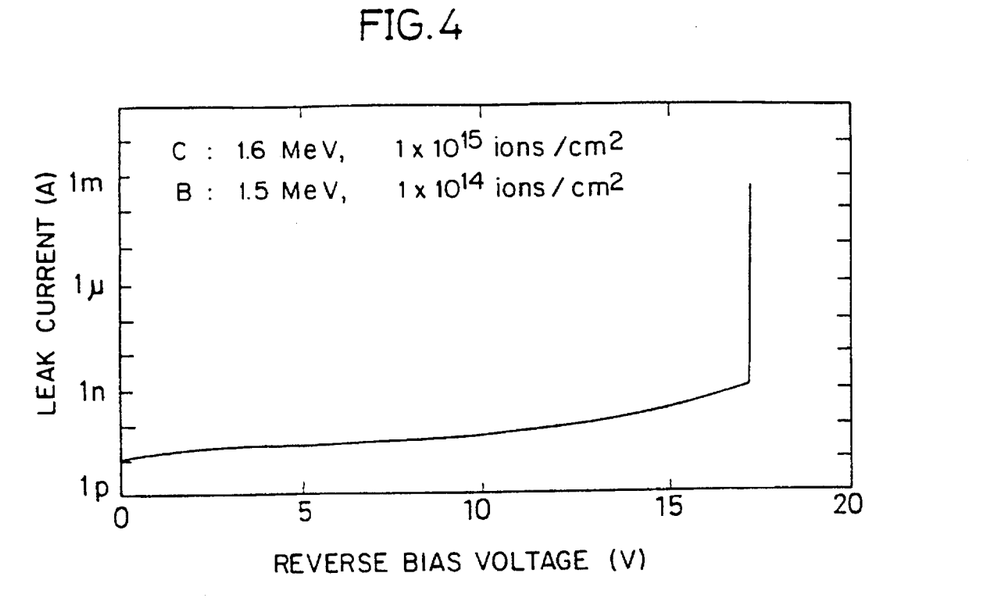
FIG. 4 is a graph showing a leak current of a substrate including a gettering layer and a buried impurity layer formed by utilizing injection of carbon and boron ions.
Figure 5:
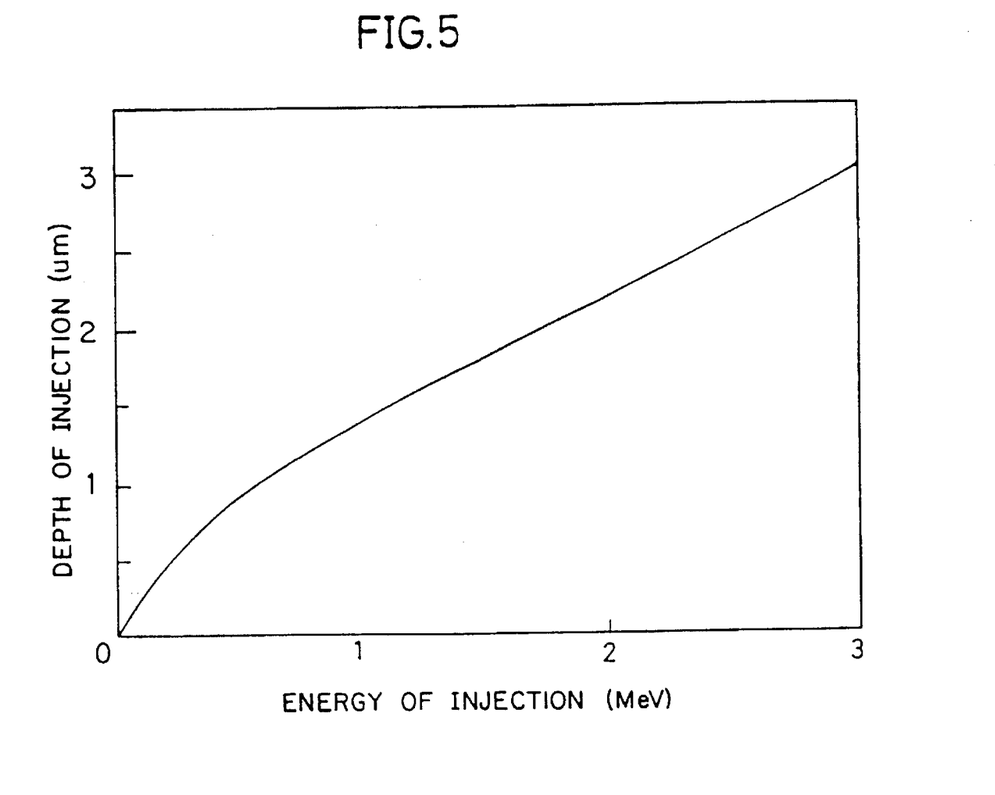
FIG. 5 is a graph showing a relationship between energy and depth of injecting carbon ions into a silicon substrate.

Referring to FIG. 4, this graph shows another example of leak current of a semiconductor substrate as shown in FIG. 1C. While FIG. 4 resembles FIG. 2A, in FIG. 4 carbon instead of oxygen is ion-injected with an energy of 1.6 MeV in $1 \times 10^{15}$ ions/cm$^2$. It will be seen that the leak current of the substrate is restrained also by the gettering layer 2 formed by utilizing carbon ion injection. As seen from FIG. 5 as compared with FIG. 3, carbon is ion-injected with a lower accelerating energy than oxygen because carbon can be ion-injected deeper than oxygen with the same accelerating energy.

Further, the gettering layer 2 may be formed by utilizing ion injection of fluorine, chlorine or nitrogen. However, ion injection of an element that determines the conductivity type is not suited for formation of the gettering layer 2. The reasons are that the secondary crystal defects resulting from the ion injection of a conductivity type determining element have a weak gettering function, and that a conductivity type determining element, from the viewpoint of its electric function, must not be ion-injected in a very high concentration.

Figure 6A:
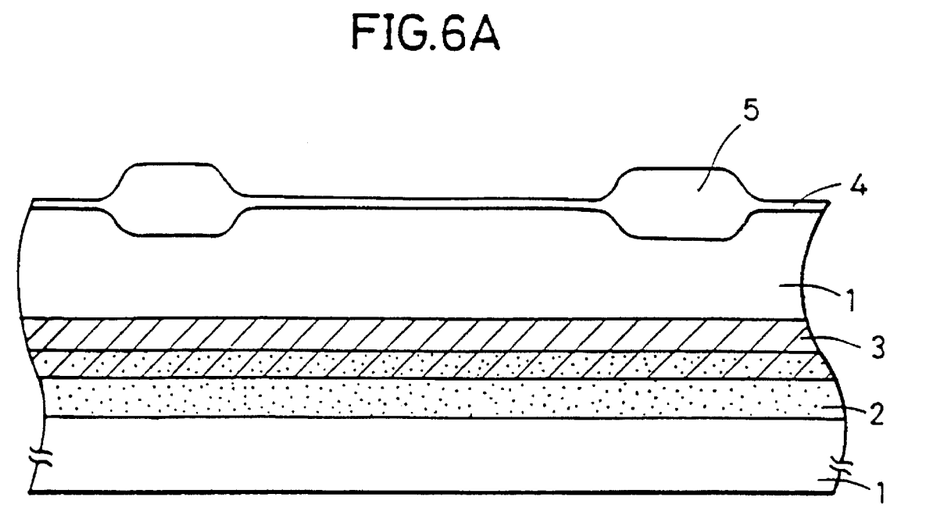
FIGS. 6A and 6B are sectional views showing other embodiments of this invention.
Figure 6B:
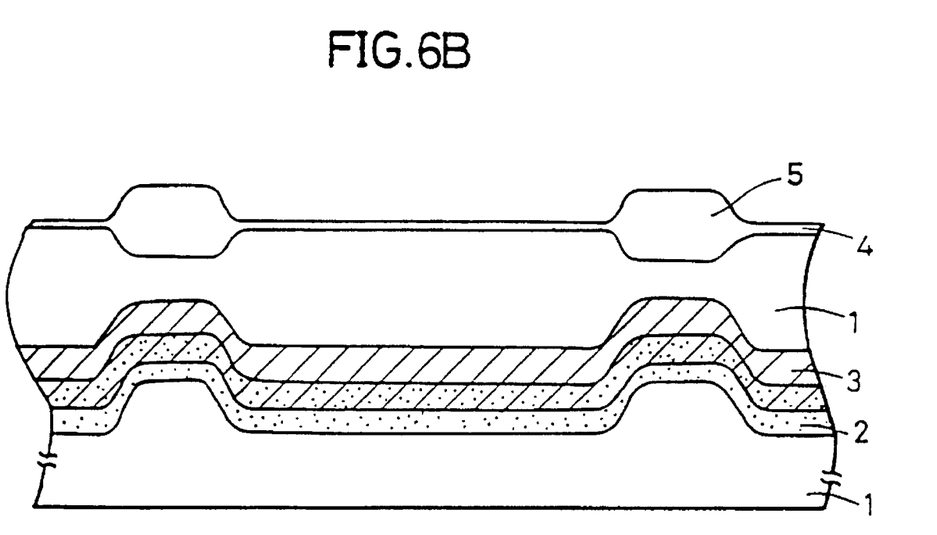

In the embodiment of FIGS. 1A through 1C, the buried impurity layer 3 is formed after the isolation oxide layers 5 are formed. However, as shown in FIG. 6A, not only the ion injection for forming the gettering layer 2 but also the ion injection for forming the buried impurity layer 3 may be carried out before formation of the isolation oxide layers 5. Further, as shown in FIG. 6B, both the gettering layer 2 and buried impurity layer 3 may be formed by utilizing ion injection after formation of the isolation oxide layers 5.

It will be understood that, depending on the type of semiconductor device formed on the semiconductor substrate, the buried impurity layer 3 and gettering layer 2 may be formed at desired depths by adjusting the ion injecting energy, and quantities of ion injection may also be adjusted.

It will be understood further that, while the isolation oxide layers are used in the foregoing embodiment, trench isolation, planar isolation and other isolation modes are also available.

An example will be described hereinafter wherein a semiconductor substrate including a buried impurity layer and a gettering layer formed according to this invention is utilized for memory cells in a DRAM (random access memory) device.

Figure 7:
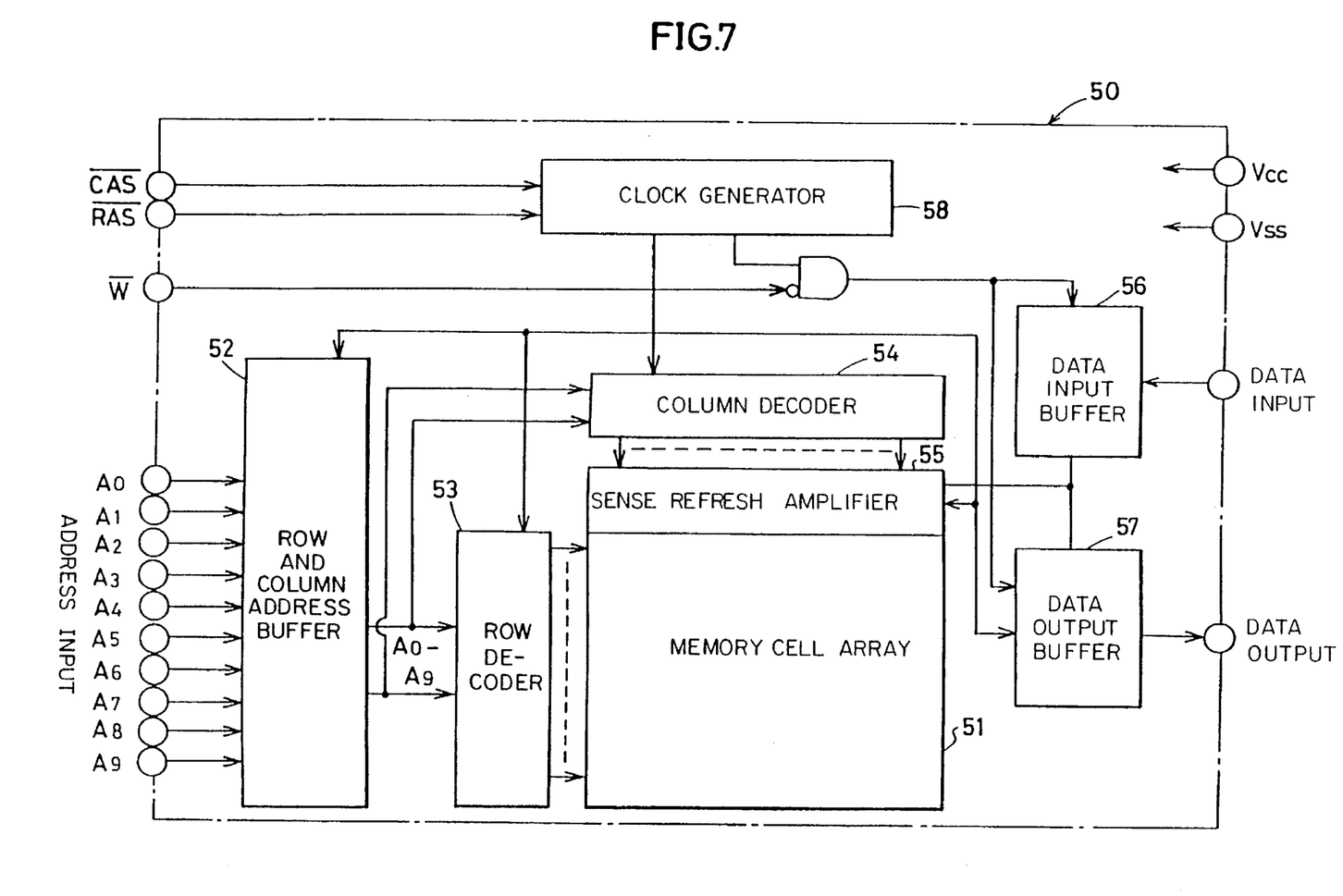
FIG. 7 is a block diagram of a DRAM device including memory cells formed by utilizing this invention.

Referring to FIG. 7, an ordinary DRAM construction is shown in block diagram. A DRAM 50 includes a memory cell array 51 for storing information data signals, a row and column address buffer 52 for receiving from outside address signals for selecting memory cells each to constituting a unit storage circuit, a row decoder 53 and a column decoder 54 for designating memory cells by decoding the address signals, a sense refresh amplifier 55 for amplifying and reading signals stored in the designated memory cells, a data input buffer 56 and a data output buffer 57 for inputting and outputting data, and a clock generator 58 for generating a clock signal.

Figure 8:
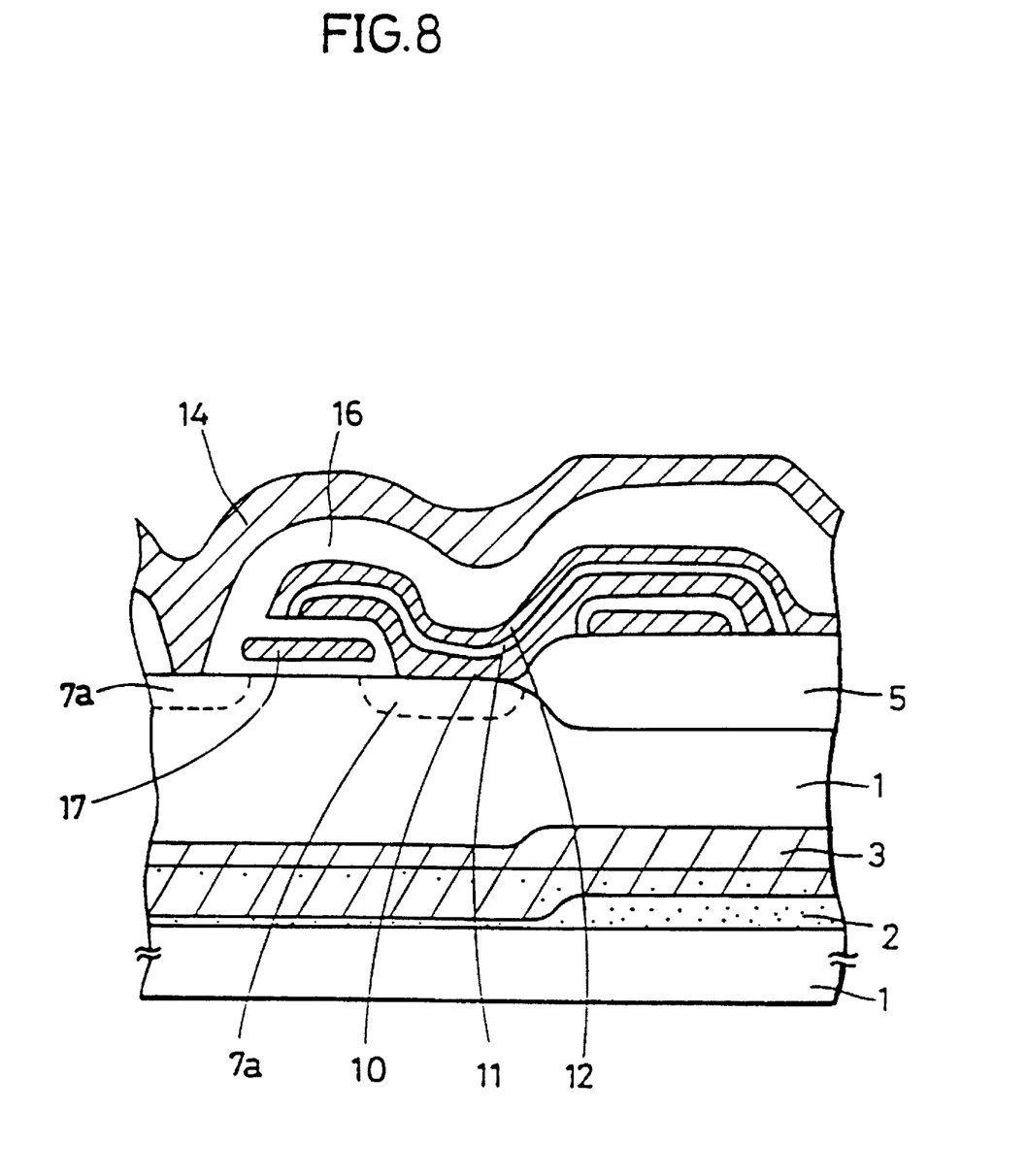
FIG. 8 is a sectional view of a memory cell formed by utilizing this invention.

Referring to FIG. 8 which is a sectional view, there is shown a stacked type cell included in the memory cell array 51 shown in FIG. 7. In the memory cell of FIG. 8, the semiconductor substrate 1 including the buried impurity layer 3 and gettering layer 2 according to this invention is used. The memory cell formed on the substrate 1 includes a source/drain region 7a, a word line 17, a storage node 10, a capacitor insulating film 11, a cell plate 12, an interlayer insulating film 16 and a bit line 14. With this memory cell, the buried impurity layer 3 absorbs carriers generated by alpha particles, thereby effectively preventing malfunctioning of the DRAM device.

According to this invention, as described above, a semiconductor device is provided which includes a buried impurity layer and a gettering layer formed in a short time and at low cost by utilizing ion injection, and which involves a reduced leak current.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:

forming a gettering layer by ion-injecting, at a dose rate in the range of $1\times10^{14}$ to about $1\times10^{15}$ ions/cm$^2$, an element, other than a conductivity type determining element, to a first depth from a main surface of a semiconductor substrate; heat-treating said semiconductor substrate;

forming a buried impurity layer by ion-injecting a conductivity type determining element to a second depth not greater than said first depth of said gettering layer; and heat-treating said semiconductor substrate.

2. A method according to claim 1, wherein said gettering layer is formed by ion injecting an element selected from the group consisting of oxygen, carbon, fluorine, chlorine and nitrogen.

3. A method according to claim 1, wherein said ion injection is carried out with an accelerating energy of several hundred keV to several MeV.

4. A method according to claim 1, wherein at least said gettering layer is annealed during formation of thermal oxidation layers for isolation.

5. A method according to claim 4, wherein said gettering layer and said buried impurity layer are both annealed during formation of thermal oxidation layers for isolation.

6. A method according to claim 1, wherein said gettering layer and said buried impurity layer are annealed simultaneously.

* * * * *